United States Patent
Harpe

(10) Patent No.: US 9,537,499 B2
(45) Date of Patent: Jan. 3, 2017

(54) CIRCUIT AND METHOD FOR COMPARATOR OFFSET ERROR DETECTION AND CORRECTION IN AN ADC

(71) Applicant: Stichting IMEC Nederland, Eindhoven (NL)

(72) Inventor: Pieter Harpe, Eindhoven (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 15/048,516

(22) Filed: Feb. 19, 2016

(65) Prior Publication Data

US 2016/0248435 A1    Aug. 25, 2016

(30) Foreign Application Priority Data

Feb. 19, 2015    (EP) .................................... 15155750
Apr. 28, 2015    (EP) .................................... 15165432

(51) Int. Cl.
  *H03M 1/10*    (2006.01)
  *H03M 1/46*    (2006.01)

(52) U.S. Cl.
  CPC ........... *H03M 1/1033* (2013.01); *H03M 1/466* (2013.01)

(58) Field of Classification Search
  CPC .... H03M 1/002; H03M 1/442; H03M 1/1245; H03M 1/12; H03M 1/00; H03M 1/1215; H03M 3/458; H03M 3/386; H03M 1/468; H03M 1/1033

(Continued)

(56) References Cited

U.S. PATENT DOCUMENTS

| | | | | |
|---|---|---|---|---|
| 6,459,335 B1 * | 10/2002 | Darmawaskita | .... | H03F 3/45977 327/124 |
| 6,606,048 B1 * | 8/2003 | Sutardja | .............. | H03M 1/0646 341/118 |

(Continued)

OTHER PUBLICATIONS

Giannini, Vito et al., "An 820uW 9b 40MS/s Noise-Tolerant Dynamic-SAR ADC in 90nm Digital CMOS", 2008 IEEE International Solid-States Circuits Conference, ISSCC 2008, Session 12, High-Efficiency Data Converters, 2008, pp. 238-239, 610.

(Continued)

*Primary Examiner* — Lam T Mai
(74) *Attorney, Agent, or Firm* — McDonnell Boehnen Hulbert & Berghoff LLP

(57) ABSTRACT

A method includes sampling an input voltage signal applied to an ADC, comparing the sampled input voltage signal with an output signal of a feedback DAC, and determining in a search logic block a digital code representation for the comparison result. The method may also include performing a calibration by: performing an additional cycle, wherein a last comparison carried out for determining a least significant bit of the digital code representation is repeated with a second comparator resolution mode different from a first comparator resolution mode, so obtaining an additional comparison; determining from a difference between results of the additional comparison and the last comparison a sign of a comparator offset error between the comparator resolution modes; and tuning, in accordance with a sign of the comparator offset error, a programmable capacitor connected at an input of the comparator, thereby inducing a voltage step to counteract the comparator offset error.

10 Claims, 4 Drawing Sheets

(58) Field of Classification Search
USPC .................................................. 341/120–155
See application file for complete search history.

(56) References Cited

U.S. PATENT DOCUMENTS

| | | | | |
|---|---|---|---|---|
| 6,806,771 | B1* | 10/2004 | Hildebrant | H03F 1/3211 |
| | | | | 330/278 |
| 7,155,979 | B2* | 1/2007 | Lasalandra | G02B 26/0841 |
| | | | | 324/661 |
| 8,779,952 | B1* | 7/2014 | Zortea | H03M 1/1004 |
| | | | | 341/118 |
| 8,884,801 | B1* | 11/2014 | Ranjbar | H03M 1/145 |
| | | | | 341/156 |
| 2005/0285763 | A1* | 12/2005 | Nguyen | H03M 3/386 |
| | | | | 341/120 |
| 2011/0285568 | A1* | 11/2011 | Harpe | H03M 1/56 |
| | | | | 341/158 |
| 2014/0197971 | A1* | 7/2014 | Kuppambatti | G06F 1/08 |
| | | | | 341/110 |
| 2015/0009059 | A1* | 1/2015 | Chen | H03M 1/187 |
| | | | | 341/155 |
| 2015/0084800 | A1* | 3/2015 | Zhang | H03M 1/0624 |
| | | | | 341/155 |

OTHER PUBLICATIONS

Harpe, Pieter et al., "A 0.7V 7-to-10bit 0-to-2MS/s Flexible SAR ADC for Ultra Low-Power Wireless Sensor Nodes", IEEE European Solid-State Circuits Conf., Sep. 2012, pp. 373-376.

\* cited by examiner

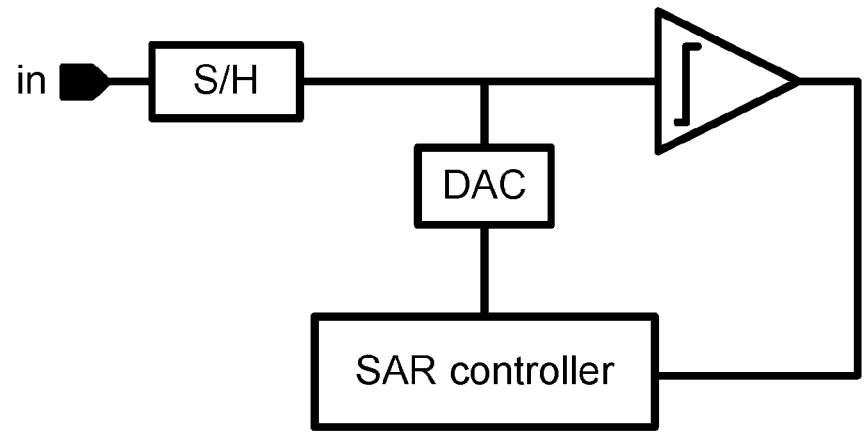
Fig.1 – Prior Art
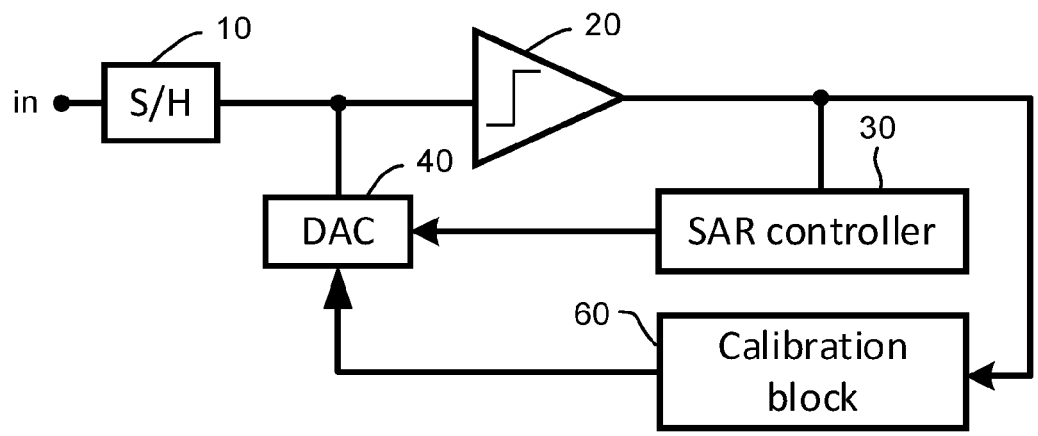
Fig.2 mode ⎣mode1⎤mode2 offset ⎣offset1⎤offset2

$V_a-V_b$  $\dfrac{C_{cal1}-C_{cal2}}{C_{dac}}VDD$

☐ cycles
▨ redundant cycle
⌐ ⌐ optional cycle for calibration

US 9,537,499 B2

CIRCUIT AND METHOD FOR COMPARATOR OFFSET ERROR DETECTION AND CORRECTION IN AN ADC

CROSS-REFERENCE TO RELATED APPLICATIONS

The present application is a non-provisional patent application claiming priority to European Patent Application No. 15155750.1 filed on Feb. 19, 2015, and European Patent Application No. 15165432.4 filed on Apr. 28, 2015, the contents of each of which are hereby incorporated by reference

TECHNICAL FIELD

The present disclosure is generally related to the field of analogue-to-digital converters (ADCs), and more particularly of successive approximation register analogue-to-digital converters (SAR ADCs).

BACKGROUND

In recent years important advances have been made in increasing the power efficiency of analogue-to-digital converters. Particularly efficient implementations are based on a successive approximation register (SAR) architecture.

In a typical successive approximation register analogue-to-digital conversion (SAR ADC) architecture the input voltage is compared against a digital-to-analogue converter (DAC) output voltage using a comparator in several cycles. The input signal first goes through a sample and hold block. The SAR search logic block executes a search algorithm, which typically performs a binary search. In the first cycle the input is compared against the middle of the ADC range. From the comparator output the most significant bit (MSB) can be determined. In the next cycle bit MSB-1 is determined and so on. A conversion to N bits normally requires N cycles. The SAR ADC is low in cost and consumes low operating power. The excellent power efficiency of the SAR converter can be attributed both to the inherent efficiency of the binary search algorithm and the simplicity of the required hardware.

High resolution SAR analogue-to-digital converters (ADCs) (>10bit) with very low power and MS/s sampling rates are popular in wireless sensor node to obtain robust wireless communication links. However, the comparator becomes one of the most power-hungry components in this resolution. However, the intrinsic accuracy (DAC matching) of a SAR ADC is limited up to 10 or 12 b in modern CMOS technologies. Scaling up the device dimensions can improve matching but deteriorates power-efficiency and speed.

A conventional SAR ADC scheme is depicted in FIG. 1. A sample and hold circuit is used, as well as a comparator, a DAC, and a digital SAR controller. The analogue signal $V_{in}$ enters the sample and hold (S/H) circuit where the signal simply is sampled and held to provide a buffer for the A/D converter. $V_{in}$ is compared to a reference voltage $V_{ref}$ at the comparator input. The digital comparison result goes to the SAR controller block comprising the search logic. The controller block adjusts the digital control signals in order to narrow the compared voltages. An adjusted digital signal is provided at an output to a digital-to-analogue converter (DAC). This signal is converted to an adjusted $V_{ref}$, which is compared to $V_{in}$ in the comparator. A common implementation of the DAC uses an array of capacitors which are controlled by the SAR controller block.

Analogue imperfections in the SAR ADC converters such as DAC mismatch and comparator offset, introduce errors that are typically mitigated through a calibration. The calibration measures and compensates for the analogue imperfections in the SAR A/D converters. However, most calibrations are implemented off-chip, as the power for the calibration circuit is relatively high when implemented on-chip. Foreground calibration is an alternative choice but it may be sensitive to environment and can introduce additional effort (e.g., manual effort) to perform the calibration.

The comparator is a power-hungry component in high-resolution SAR ADCs. To save power, two-mode comparators have been introduced (see "*A 0.7V 7-to-10 bit 0-to-2 MS/s Flexible SAR ADC for Ultra Low-Power Wireless Sensor Nodes*", P. Harpe et al., IEEE Eur. Solid-State Circuits Conf., September 2012). The comparator works in low-power mode for coarse comparisons and switches to high-precision mode for fine comparisons, resulting in significant energy reduction. However, as the offset in these two modes might be different, this scheme can introduce a dynamic offset, which may impede the conversion accuracy. Besides, the comparator offset is sensitive to environmental changes (e.g., temperature). For that reason, an offset calibration is implemented that aims to equalize the comparator offset in the two modes to similar levels. However, due to the absence of error detection capability, the offset error can only be corrected manually by iteratively tuning the capacitor value and observing the measured ADC performance.

The paper "*A 820 µW 9b 40 MS/s Noise-Tolerant Dynamic-SAR ADC in 90 nm Digital CMOS*" (V. Giannini et al., ISSCC Dig. Tech. Papers, pp. 238-239, February 2008) presents an ADC with two comparators with different noise performance to reduce the overall power consumption. It uses two comparators with different input-referred noise. Due to the use of two separate comparators, there are two independent offsets. The offset difference between the two comparators is corrected by loading the calibration settings through a serial register.

However, in these references, the comparator offset error cannot be directly measured. As a result, the comparator offset is compensated manually. Hence, there is a desire for a low-power fully automated on-chip background calibration approach for correcting comparator offset.

SUMMARY

The present disclosure relates to a circuit and method for comparator offset detection and correction in an A/D converter, whereby the error is measured directly, and wherein the overhead is kept limited.

In a first aspect, the disclosure relates to a method for calibrating an analog-to-digital converter (ADC) converting an input voltage signal into a digital output signal representing the input voltage signal. In one example, the method includes sampling the input voltage signal applied to the analog-to-digital converter, comparing the sampled input voltage signal with an output signal of a feedback digital-to-analogue converter (DAC), and determining in a search logic block of the ADC a digital code representation for a comparison result. In this example, the method also includes performing a calibration by performing an additional cycle wherein a last comparison carried out for determining a least significant bit of the digital code representation is repeated with a second comparator resolution mode different from a first comparator resolution mode used in at least the last comparison, so obtaining an additional comparison. Performing the calibration may also include determining from a difference between results of the additional comparison and the last comparison a sign of a comparator offset error between the first and the second comparator resolution modes. In addition, performing the calibration may also include tuning, in accordance with the sign of the comparator offset error, a programmable capacitor connected at an input of the comparator, thereby inducing a voltage step to counteract the comparator offset error.

The proposed solution indeed allows for detection and correction of comparator offset errors in a simple and cost effective way. It is assumed that the A/D converter contains a comparator which is operable in two resolution modes. After that the digital code representation has been determined, an additional cycle is run, whereby the comparator is used in a second comparator resolution mode. The last comparison is thereby repeated, but with a different comparator resolution mode than before. From the difference between the comparator results in the last cycle and in the additional cycle an indication of the sign of a comparator offset error between the two is discovered. Next, a programmable capacitor connected at the comparator input is tuned, whereby a voltage step is induced in the comparator to counteract the comparator offset error between the two modes.

In an embodiment, the calibration is performed only when the digital code representation is detected to be equal to a predefined calibration trigger code.

In an embodiment, the digital output signal comprises N bits and the digital code representation comprises N+1 bits. In other words, there is one redundant bit.

In an embodiment, the sign of the comparator offset error is stored in a calibration register.

In an embodiment, the method for calibrating further comprises applying a low pass filtering to a signal comprising the sign of the comparator offset error.

In another aspect, the disclosure relates to an analogue-to-digital converter for converting an input voltage signal into a digital output signal representing the input voltage signal. In one example, the analogue-to-digital converter (ADC) includes sampling means for sampling the input voltage signal, a comparator arranged for receiving the sampled input voltage signal, and a digital-to-analogue converter (DAC) comprising an array of capacitors. The ADC also may include a search logic block arranged for receiving a comparator output signal from the comparator, for providing input to the DAC, and for producing a digital code representation for the comparator results. Further, the ADC may include a calibration block arranged for executing a calibration algorithm comprising performing an additional cycle, wherein the last comparison carried out for determining a least significant bit of the digital code representation is repeated with a second comparator resolution mode different from a first comparator resolution mode used in at least the last comparison, so obtaining an additional comparison. The calibration algorithm may also include determining from the difference between results of the additional comparison and the last comparison a sign of a comparator offset error between the first and the second comparator resolution mode, and tuning, in accordance with the sign of the comparator offset error, a programmable capacitor connected at the input of the comparator, thereby inducing a voltage step to counteract the comparator offset error.

In an embodiment the search logic block is implemented as a successive approximation register.

The programmable capacitor may also comprise a set of switchable binary scaled calibration capacitors.

In another embodiment the analogue-to-digital converter comprises detection means for detecting whether the digital code representation is equal to a predefined calibration trigger code and for activating the calibration block.

For purposes of summarizing the disclosure and the advantages achieved over the prior art, certain objects and advantages of the disclosure have been described herein. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

The above and other aspects of the disclosure will be apparent from and elucidated with reference to the embodiment(s) described hereinafter.

DESCRIPTION OF THE DRAWINGS

The disclosure will now be described further, by way of example, with reference to the accompanying drawings, wherein like reference numerals refer to like elements in the various figures.

FIG. 1 illustrates a conventional successive approximation register (SAR) ADC scheme.

FIG. 2 illustrates a high level scheme of an N bit ADC according to this disclosure.

DETAILED DESCRIPTION

Figure 3:
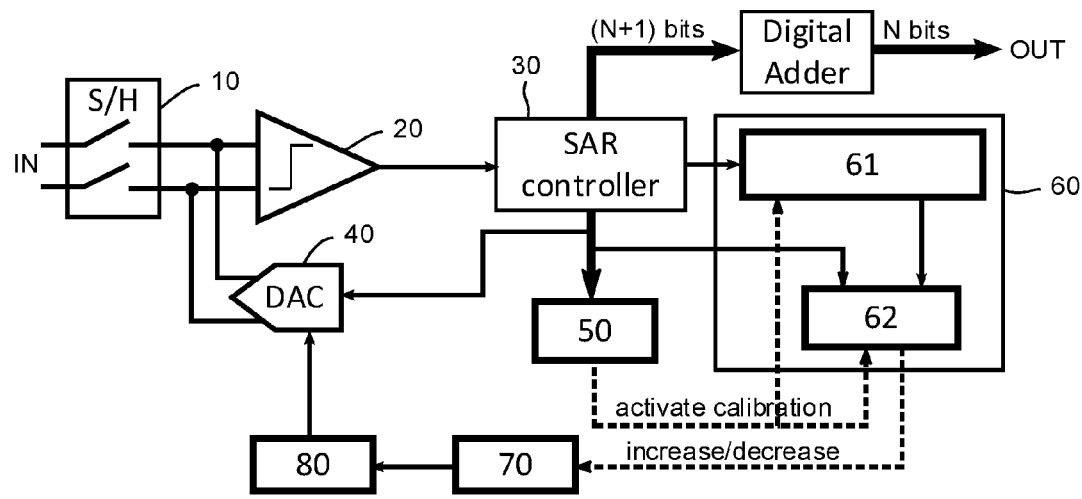
FIG. 3 illustrates a more detailed scheme of an N bit ADC according to an embodiment of this disclosure.

The present disclosure will be described with respect to particular embodiments and with reference to certain drawings but the disclosure is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The present disclosure presents a low-power fully automated on-chip calibration for comparator offset that utilizes a direct error detection and correction scheme.

FIG. 2 illustrates the architecture of an ADC adapted for performing a calibration algorithm to correct comparator offset according to this disclosure. FIG. 2 shows the sample and hold switches 10, a comparator 20, a SAR search logic block 30, and a feedback DAC 40. Redundancy can be provided by determining in the search logic block in (N+1) cycles a code representation with (N+1) bits. In this way the comparator noise requirements can be relaxed. The N bit output can be calculated by on-chip digital adders from the N+1 bit SAR output. The comparator 20 is a two-mode comparator operable either in low-power mode (mode1) for coarse comparisons or in high-precision higher-power mode (mode2) for fine comparisons. The automated calibration according to the disclosure is capable of suppressing comparator offset errors with negligible overhead in area and power. The calibration block 60 is also shown in the embodiment of FIG. 2.

A more detailed block diagram of a SAR ADC with the proposed calibration block 60 is shown in FIG. 3. In the illustrated embodiment the use of a redundant bit scheme is assumed: the SAR controller 30 outputs N+1 bits and the digital adder outputs the resulting N bit output code. The calibration block may only be enabled for a limited set of SAR codes which are selected for comparator offset error detection. The detection is performed by a detection block 50 that enables via calibration logic 61 a calibration algorithm 62 to perform in an additional comparison cycle background calibration only for these specific codes. The detection block also triggers the DAC for an additional cycle. The results can be stored in the calibration registers 80 for the calibration of the comparator. One or more registers may be preceded by a low pass filter (LPF) 70 to stabilize the calibration loop and to filter noise.

Figure 4:
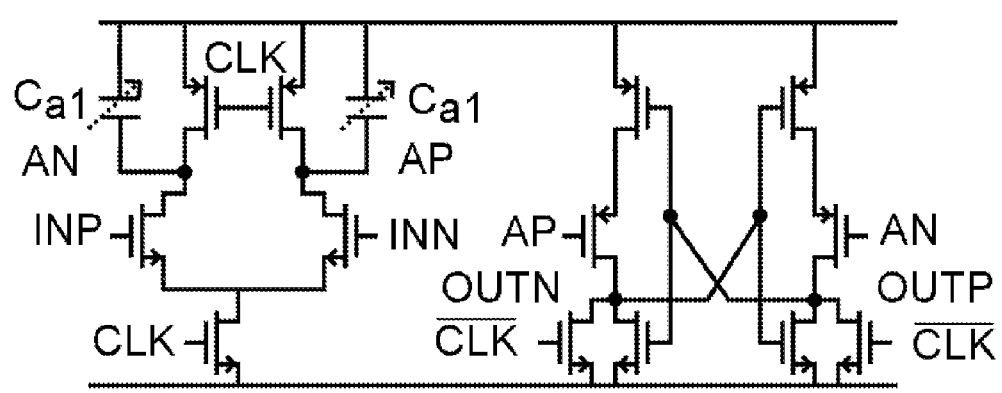
FIG. 4 represents a schematic of a two-mode comparator.

FIG. 4 illustrates an example implementation of a two-mode comparator. The capacitor $C_{a1}$ is switched to obtain the two-mode operation of the comparator. The capacitor $C_{a1}$ is implemented as a part of the comparator.

Figure 5:
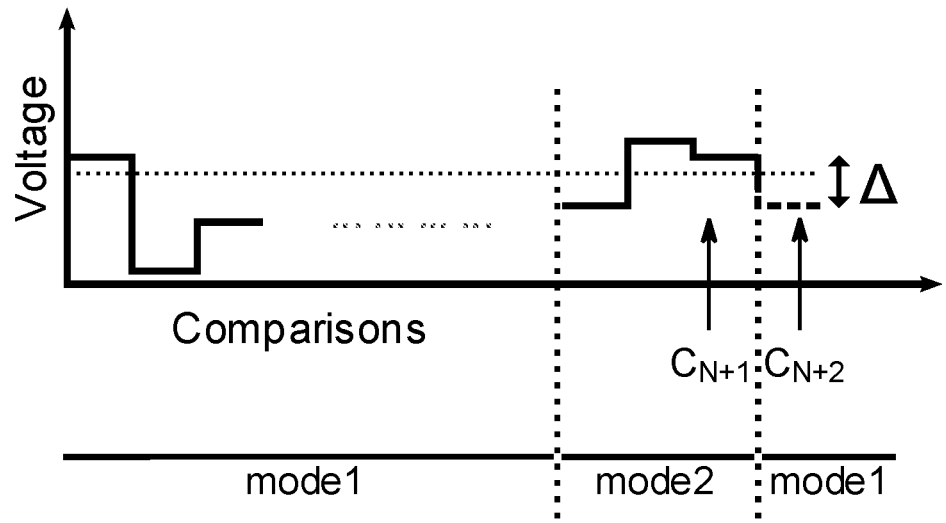
FIG. 5 illustrates the approach adopted in the proposed calibration method.
Figure 6:
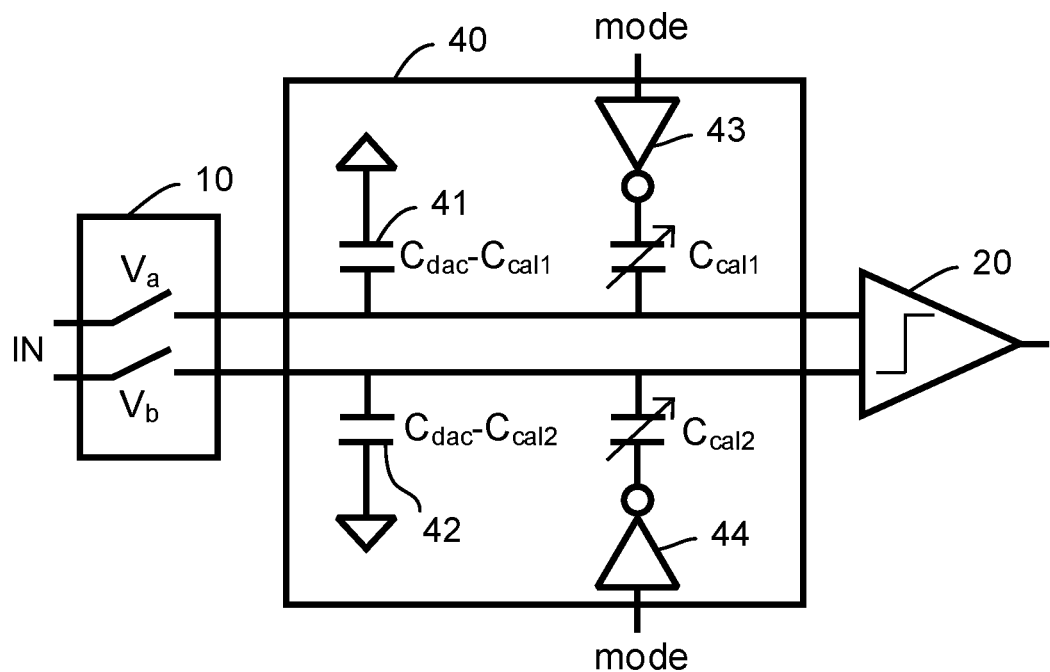
FIG. 6 illustrates the correction for the comparator offset error.
Figure 7:
FIG. 7 illustrates the correction for the comparator offset error.

FIGS. 5 to 7 illustrate the analog calibration method for the comparator offset. As set out above, the comparator typically operates in a low-power mode (mode 1) for the coarse comparisons when determining the most significant bits, and in a high-precision higher-power mode (mode2) for fine comparisons encountered when determining the less significant bits. This is readily seen in FIG. 5. In other words, the comparator switches from mode1 to mode2 during each conversion, causing an offset step (offset2−offset1). The goal of the comparator calibration is to equalize the offset for mode1 and mode2. To detect this offset difference, an additional $((N+2)^{th})$ calibration cycle repeats the same comparison as the $(N+1)^{th}$ cycle, i.e. the cycle wherein the least significant bit is determined. The DAC code thereby remains unchanged, but the comparator is switched from mode2 to mode1, as indicated in FIG. 5. If the two results from these comparisons are different, it reveals the sign of the offset difference and thus the direction in which the comparator correction circuit needs to be tuned. Assuming a differential implementation as in FIG. 6 this is corrected during normal operation by an analog correction circuit, which comprises two programmable capacitors ($C_{cal1}$ and $C_{cal2}$) connected to the input of the comparator (see FIG. 6). The two programmable capacitors are switchable via a logic circuit 43, 44. The capacitors $C_{cal1}$ and $C_{cal2}$ can be also form part of the DAC. The programmable capacitors are switched when the comparator changes mode, thus inducing a voltage step $V_a$-$V_b$ that counteracts the comparator offset step once the calibration is correctly settled. This is figuratively illustrated in FIG. 7. In one example, $C_{cal1}$ and $C_{cal2}$ are implemented as a binary-scaled bank of switchable capacitors with 1 LSB steps (e.g. $2^0, 2^1, \ldots, 2^K$). If a redundant bit scheme is adopted, the remaining offset error after calibration (within 1 LSB) is inherently compensated by the redundancy scheme of the SAR ADC.

The calibration algorithm is in one embodiment only activated for a limited set of SAR codes, thus the detection occurrence rate can be reduced to a negligible part (e.g. below 0.5%) of all AD conversions. A single SAR code can suffice to perform the calibration. In other embodiments, the calibration can be triggered by any SAR code; it does not require a specific SAR code as trigger code. This saves power while time-varying comparator offsets can still be calibrated properly. The occurrence rate of the code detection can be increased or decreased by increasing or decreasing the number of SAR codes used for code detection. Moreover, the occurrence rate of the correction can be increased or decreased by increasing or decreasing the order of the LPF 70 in the loop. As a result, the convergence time of the calibration can also be increased or decreased.

Figure 8:
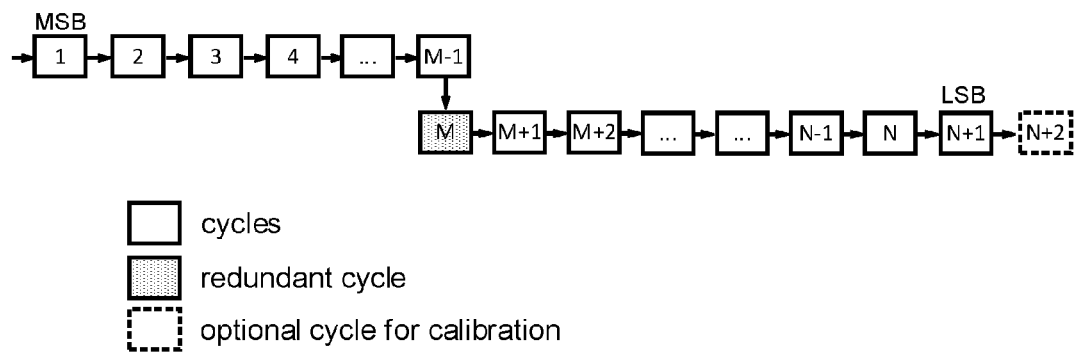
FIG. 8 illustrates a conversion scheme with a redundant bit M.

As already mentioned, in an embodiment a redundant bit scheme is applied. The location of the redundant bit M in FIG. 8 can be chosen according to the following analysis: from MSB to M bit, the IRN (Input referred Noise) of the comparator should meet the relatively lower accuracy (M bit accuracy), while from M+1 bit to the LSB, the IRN of the comparator should meet relatively higher accuracy (N bit accuracy). When the location of the redundant bit shifts from the MSB to the LSB part, the total power consumption of the coarse cycles increases while the total power consumption of the fine cycles will decrease. As result, it is possible to find an optimum range where the power consumption of the comparator is the lowest.

The signal flow when calibration occurs is shown in FIG. 3. In one embodiment the detection block 50 also generates a calibration enable signal indicating whether the calibration should take place or not. For each conversion, at the $(N+2)^{th}$ cycle, the detection block 50 senses whether the internal $(N+1)$ bit DAC code is one of the predetermined codes for calibration (e.g., 11000XX). If so, the calibration enable signal becomes active. As a result, the detection block 50 forces the comparator 20 to its alternative mode (e.g., from mode1 to mode1). Any arbitrary code can be chosen for use as a calibration code. Moreover, the calibration enable signal enables the additional cycle $((N+2)^{th})$ cycle) via the calibration logic 61. After comparison, the calibration logic 61 produces an output $C_{N+2}$, which is feedforwarded to the calibration algorithm 62 together with the comparison result of the $(N+1)^{th}$ cycle $C_{N+1}$ from the SAR logic. The calibration algorithm 62 generates an error sign, which indicates the direction of correction for the analog correction circuit. The error sign is sent to the LPF 70 to filter out the noise. The LPF 70 outputs a delayed error sign to the calibration registers 80. The calibration registers 80 may be an accumulator accumulating the single-bit error sign into a binary scaled digit. The binary-scaled signal at the output of the calibration registers 80 is then used for the analog corrections circuit, i.e. to control directly the programmable capacitor $C_{cal1}$, $C_{cal2}$. For example, for a programmable capacitor comprising a bank of four binary-scaled switchable capacitors, a binary-scaled signal of, e.g., 1001, will switch the MSB and the LSB bank capacitors.

The proposed solution offers many potential advantages. One comparator with two modes is used, avoiding a large unpredictable offset from using two separate comparators. The error of the comparator offset in two modes can be directly detected and corrected in the analog domain. The calibration requires performing only one additional cycle, thus the cost in speed or power is very low. Correction of the offset error is performed, based on the detected error sign, directly in the analog domain instead of the digital domain. The power consumption due to the small correction capacitors (<1 LSB) is negligible. The calibration convergence time can be adapted by adjusting the occurrence rate in code detection and the delay in the correction path as described above. Thus, it features a possibility of a low-power calibration with low activation rate and/or with relatively fast convergence time. The calibration can be run in the background without interrupting the ADC operation. The offset calibration only needs to perform coarse correction, as the fine correction (correction of an offset error within 1 LSB) is intrinsically done by the redundancy scheme. The algorithm is very simple and can be easily extended to other resolutions without heavy work overhead.

The error correction is fully autonomous based on the detected error sign and the circuitry is simple (NAND gates plus a capacitor). The error detection and correction scheme is implemented in the analog domain, and thus avoids complex digital operations and circuitry (e.g., multiplication, coefficient learning, Look Up Table). Further, it enables a potential good power efficiency and small area when implemented on silicon. It gives an intrinsic advantage in area and speed as well as complexity in circuit. No additional off-chip components (e.g., microprocessors, ROM) are needed.

It is to be noted that the proposed calibration can be applied in the foreground prior to normal operation. The input voltage is in that case a voltage from a predetermined set of voltages resulting in the generation of a SAR code. As there is no requirement on the SAR codes suitable for the calibration purposes, any input voltage can be applied and used for the purpose of comparator offset calibration.

While the disclosure has been illustrated and described in detail in the drawings and foregoing description, such illustration and description are to be considered illustrative and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A method for calibrating an analog-to-digital converter (ADC) converting an input voltage signal into a digital output signal representing the input voltage signal, the method comprising:
   sampling the input voltage signal applied to the analog-to-digital converter;
   comparing, with a comparator, the sampled input voltage signal with an output signal of a feedback digital-to-analogue converter (DAC);
   determining, in a search logic block of the ADC, a digital code representation for a result of the comparison; and
   performing a calibration by:
      performing an additional cycle, wherein a last comparison carried out for determining a least significant bit of the digital code representation is repeated with a second comparator resolution mode different from a first comparator resolution mode used in at least the last comparison, so obtaining an additional comparison;

determining from a difference between results of the additional comparison and the last comparison a sign of a comparator offset error between the first and the second comparator resolution modes; and tuning, in accordance with the sign of the comparator offset error, a programmable capacitor connected to a input of the comparator, thereby inducing a voltage step to counteract the comparator offset error.

2. The method for calibrating as in claim 1, wherein the calibration is performed when the digital code representation is detected to be equal to a predefined calibration trigger code.

3. The method for calibrating as in claim 1, wherein the digital output signal comprises N bits, and wherein the digital code representation comprises (N+1) bits.

4. The method for calibrating as in claim 1, wherein the sign of the comparator offset error is stored in a calibration register.

5. The method for calibrating as in claim 1, further comprising applying a low pass filtering to a signal comprising the sign of the comparator offset error.

6. An analogue-to-digital converter for converting an input voltage signal into a digital output signal representing the input voltage signal, the analogue-to-digital converter comprising:

sampling means for sampling the input voltage signal;

a comparator arranged for receiving the sampled input voltage signal;

a digital-to-analogue converter (DAC) comprising an array of capacitors;

a search logic block arranged for receiving a comparator output signal from the comparator, for providing input to the DAC, and for producing a digital code representation for comparator results;

a calibration block arranged for executing a calibration algorithm comprising:

performing an additional cycle, wherein a last comparison carried out for determining a least significant bit of the digital code representation is repeated with a second comparator resolution mode different from a first comparator resolution mode used in at least the last comparison, so obtaining an additional comparison;

determining from a difference between results of the additional comparison and the last comparison a sign of a comparator offset error between the first and the second comparator resolution mode; and tuning, in accordance with the sign of the comparator offset error, a programmable capacitor connected at the input of the comparator, thereby inducing a voltage step to counteract the comparator offset error.

7. The analogue-to-digital converter as in claim 6, wherein the search logic block is implemented as a successive approximation register.

8. The analogue-to-digital converter as in claim 7, wherein the programmable capacitor comprises a set of switchable binary scaled calibration capacitors.

9. The analogue-to-digital converter as in claim 8, comprising detection means for detecting whether the digital code representation is equal to a predefined calibration trigger code and for activating the calibration block.

10. The analogue-to-digital converter as in claim 8, wherein the programmable capacitor is comprised in the DAC.

* * * * *